(12) United States Patent
Tian

(10) Patent No.: US 11,679,899 B2
(45) Date of Patent: Jun. 20, 2023

(54) EXPERIMENTAL BENCH FOR A UAV POWER SYSTEM AND AVIONICS EQUIPMENT

(71) Applicant: Shanghai Autoflight Co., Ltd., Shanghai (CN)

(72) Inventor: Yu Tian, Hong Kong (CN)

(73) Assignee: SHANGHAI AUTOFLIGHT CO., LTD., Jiangsu Province (CN)

( * ) Notice: Subject to any disclaimer, the term of this patent is extended or adjusted under 35 U.S.C. 154(b) by 0 days.

(21) Appl. No.: 17/882,567

(22) Filed: Aug. 6, 2022

(65) Prior Publication Data

US 2023/0043316 A1 Feb. 9, 2023

(30) Foreign Application Priority Data

Aug. 6, 2021 (CN) .......................... 202121827721.1

(51) Int. Cl.
*B64F 5/60* (2017.01)
*G01R 1/04* (2006.01)
*G01R 31/00* (2006.01)
*B64C 39/02* (2023.01)

(52) U.S. Cl.
CPC .................. *B64F 5/60* (2017.01); *G01R 1/04* (2013.01); *G01R 31/008* (2013.01); *B64C 39/024* (2013.01)

(58) Field of Classification Search
CPC .... B64F 1/228; B64F 5/00; B64F 5/60; B64C 39/024; G01R 1/04; G01R 31/008; G01M 9/00; G01M 9/06
See application file for complete search history.

(56) References Cited

FOREIGN PATENT DOCUMENTS

| CN | 110182381 A | * | 8/2019 | |
|----|-------------|---|--------|---|
| CN | 111232244 A | * | 6/2020 | |
| CN | 113200152 A | * | 8/2021 | ................ B64F 5/60 |

OTHER PUBLICATIONS

Bao et al_CN111232244A_English Translation with Figures, 2020 (Year: 2020).*
Wang et al_CN110182381A_English Translation with Figures, 2019 (Year: 2019).*
English Translation of Wang Lei et al_CN_113200152A_2021_ English Translation with Figures (Year: 2021).*

* cited by examiner

*Primary Examiner* — Jermele M Hollington
*Assistant Examiner* — Suresh K Rajaputra
(74) *Attorney, Agent, or Firm* — WPAT Law, P.C.; Anthony King

(57) ABSTRACT

An experimental bench for an unmanned aerial vehicle (UAV) power system and avionics equipment, which relates to the technical field of UAV test, comprising a support component, a power system load-bearing component, an avionics equipment load-bearing component, a jacking component and a roller component. A plurality of power system load-bearing components are provided, and are fixedly arranged on the support components, respectively, and each power system load-bearing component is configured to carry the power system of a UAV; the avionics equipment load-bearing component is fixedly arranged on the support component, and the avionics equipment load-bearing component is configured to bear the avionics equipment of the UAV; the output end of the jacking component is fixedly connected to the bottom end of the support component.

10 Claims, 4 Drawing Sheets

EXPERIMENTAL BENCH FOR A UAV POWER SYSTEM AND AVIONICS EQUIPMENT

TECHNICAL FIELD

The application relates to the technical field of UAV test, in particular to an experimental bench for a UAV system and avionics equipment.

BACKGROUND

In the process of UAV research & development, it is necessary to test the whole power system and avionics equipment of UAV.

In the prior art, the test of the whole power system and avionics equipment requires that the whole power system and avionics equipment be installed on the main body of the UAV, respectively, and then control the elevation and movement of the main body of the UAV to realize the test of the whole power system and avionics equipment. However, it takes more time to install the whole power system and avionics equipment on the main body of UAV, resulting in a long test duration and low efficiency of the whole power system and avionics equipment.

Therefore, it is necessary to design an efficient experimental bench for a UAV power system and avionics equipment to test the whole power system and avionics equipment.

SUMMARY OF THE APPLICATION

The application aims to provide an experimental bench for a UAV power system and avionics equipment, which is used for the test of the power system and avionics equipment, without installing the power system and avionics equipment on the UAV, thereby shortening the duration of the power system test and avionics equipment test, and improving the efficiency of the power system and avionics equipment test.

As conceived above, the technical solution adopted by the application is:
An experimental bench for a UAV power system and avionics equipment, including:
A support component;
A plurality of power system load-bearing components, which are fixedly arranged on the support components, respectively, and each of which is configured to carry a UAV power system;
An avionics equipment load-bearing component, which is fixedly arranged on the support component and configured to carry a UAV avionics equipment;
A jacking component, of which the output end is fixedly connected to the bottom end of the support component;
A roller component, which comprises a roller frame and a guide wheel which is connected to the roller frame in a rolling manner, and the roller frame is fixedly connected to the jacking component.

The power system load-bearing component includes a mounting plate, a fixing seat and a connector, the mounting plate is fixedly connected to the support component, and the fixing seat is spaced from the mounting plate and connected to the mounting plate through the connector.

The fixing seat is provided with a mounting hole.

The support component includes an outer frame and a cross frame connected to the outer frame, a plurality of the power system load-bearing components are fixedly connected to the outer frame, respectively, the avionics equipment load-bearing components are fixedly connected to the intersection of the cross, and the output end of the jacking component is fixedly connected to the outer frame.

The outer frame includes two X-direction frames arranged opposite to each other and a Y-direction frame connected between the two X-direction frames and arranged opposite to each other. The cross frame is connected to the two X-direction frames and the two Y-direction frames, respectively, and each X-direction frame is spaced with two power system load-bearing components.

The outer frame also includes a beam, both ends of which are connected to the two X-direction frames and fixedly connected with a power system load-bearing component, respectively.

The outer frame also includes two side brackets, which correspond to two Y-direction frames one by one. The side bracket includes a mounting rod and two first inclined rods, one end of the two first inclined rods is fixedly connected to the corresponding Y-direction frame, the other end of the two first inclined rods is fixedly connected to the mounting rod, and the mounting rod is fixedly connected to a power system load-bearing component.

The Y-direction frame includes two first connecting rods arranged at intervals, and the side bracket also includes a second inclined rod. One end of the two first inclined rods is fixedly connected to the first connecting rod of the corresponding Y-direction frame, respectively, one end of the second inclined rod is fixedly connected to the other first connecting rod of the corresponding Y-direction frame, and the other end of the second inclined rod is fixedly connected to the mounting rod.

The avionics equipment load-bearing component has a plurality of wire holes.

The jacking component includes a trailer jack.

The application has at least the following beneficial effects:

The experimental bench for a UAV power system and avionics equipment provided by the application can realize the fixing support of the power system by arranging the power system load-bearing component, and can realize the fixing support of the avionics equipment by arranging the avionics equipment load-bearing components, without installing the power system and avionics equipment on the UAV. In addition, the application also realizes the simultaneous test of the power system and avionics equipment, reduces the duration of power system test and avionics equipment test, and improves the efficiency of power system and avionics equipment test.

Figure 1:
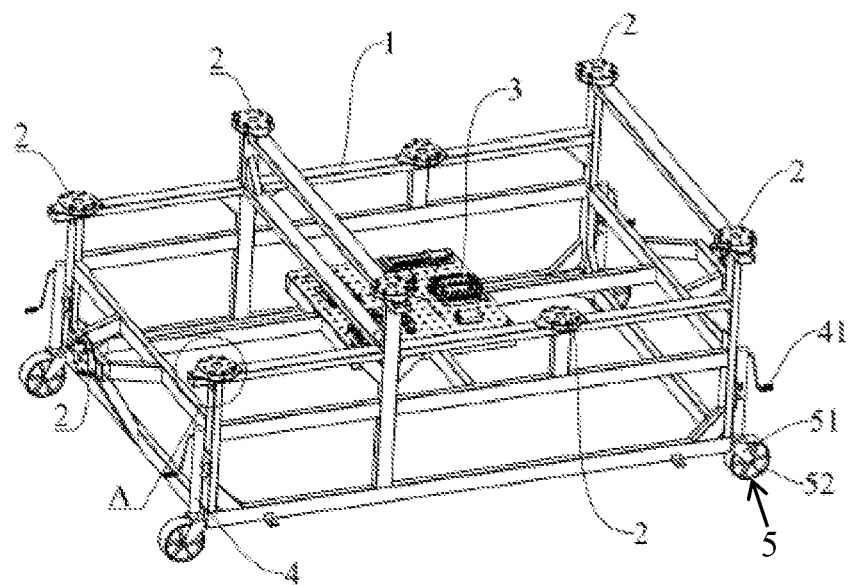
FIG. 1 is the structural diagram I of the experimental bench for a UAV power system and avionics equipment provided by an embodiment of the application.

In the figures:
1. Support component; 11. Cross frame; 12. X-direction frame; 121. Second connecting rod; 122. Reinforcing rod; 13. Y-direction frame; 131. First connecting rod; 14. Beam;

15. Side bracket; 151. Mounting rod; 152. First inclined rod; 153. Second inclined rod; 2. Power system load-bearing component; 21. Mounting plate; 22. Fixing seat; 221. Mounting hole; 23. Connector; 3. Avionics equipment load-bearing component; 31. Wire hole; 4. Jacking component; 41. Handle; 5. Roller component; 51. Roller stand; 52. Guide wheel.

DESCRIPTION OF THE PREFERRED EMBODIMENTS

In order to make clearer the technical issues solved, the technical solution adopted and the technical effect achieved by the application, the technical solution of the application is further described below in combination with the figures and through the description of the preferred embodiments. It can be understood that the preferred embodiments described here are only used to explain the application, not to limit the application. In addition, it should be noted that for the convenience of description, only some parts related to the application rather than all of them are shown in the figures.

In the description of the application, it should be noted that the orientation or position relationship indicated by the terms "center", "upper", "lower", "left", "right", "vertical", "horizontal", "inner", "outer" and so on is based on the orientation or position relationship shown in the figures, only for the convenience of describing the application and simplifying the description, rather than indicating or implying that the device or element referred to must have a specific orientation, or be constructed and operated in a specific direction, so it cannot be understood as a limitation of the application. In addition, the terms "first" and "second" are used only for descriptive purposes and cannot be understood as indicating or implying relative importance.

In the description of the application, it should be noted that unless otherwise specified and limited, the terms "installation", "connect" and "connection" should be understood in a broad sense, for example, it can be fixedly connected or detachably connected. It can be mechanical connection or electrical connection. It can be directly connected, or indirectly connected through an intermediate medium, and it can be the connection between two elements. For those skilled in the art, the specific meaning of the above terms in the application can be understood in specific circumstances.

This embodiment provides an experimental bench for a UAV power system and avionics equipment, which is used to support the UAV power system and avionics equipment that need to be tested. It can simulate the position of the power system and avionics equipment on the UAV without needing to install the power system and avionics equipment onto the UAV. It can also realize the simultaneous test of the power system and avionics equipment, thus improving the efficiency of the test of power system and avionics equipment. It should be noted that the experimental bench for a UAV power system and avionics equipment provided in this embodiment is used to conduct static tests on the power system and avionics equipment. After the power system and avionics equipment pass the static tests, they can be disassembled and mounted to the dynamic test device.

As shown in FIG. 1, the experimental bench for a UAV power system and avionics equipment includes support component 1, power system load-bearing component 2, avionics equipment load-bearing component 3, jacking component 4 and roller component 5.

Among them, the support component 1 is in a frame structure, so that the cables connecting the UAV power system and the avionics equipment can pass through it.

Exemplarily, in order to better simulate the UAV, the length of the support component 1 is the same as that of the UAV, and the height of the support component 1 is the same as that of the UAV.

There is a plurality of power system load-bearing components 2, and each of them is configured to carry the UAV power system. Specifically, a plurality of power system load-bearing components 2 correspond to a plurality of UAV power systems one by one, and each of such power systems is fixedly connected to its corresponding power system load-bearing component 2. A plurality of power system load-bearing components 2 are fixedly arranged on the support component 1, respectively, and the arrangement position of the power system load-bearing component 2 on the support component 1 meets the following requirements: after the power system is installed on its corresponding power system load-bearing component 2, it is consistent with the installation position of the power system on the UAV, that is, the position coordinate of the power system on the UAV is consistent with that on the support component 1 after the power system is installed on the power system load-bearing component 2, so that the experimental bench for a UAV power system and avionics equipment can accurately simulate the operation condition of the power system, thus improving the accuracy of the power system test.

Refer to FIG. 1, the avionics equipment load-bearing component 3 is fixed arranged on the support component 1, and it is configured to carry the avionics equipment of the UAV. Moreover, the arrangement position of the avionics equipment load-bearing component 3 meets the following requirements: when the avionics equipment is installed on the avionics equipment load-bearing component 3, it is consistent with the installation position of the avionics equipment on the UAV, that is, the position coordinates of the avionics equipment on the UAV are consistent with the position coordinates of the avionics equipment on the support component 1 after the avionics equipment is installed on the avionics equipment load-bearing component 3, the experimental bench of UAV power system and avionics equipment can accurately simulate the operation condition of avionics equipment, thus improving the accuracy of avionics equipment test.

As shown in FIG. 1, the output end of the jacking component 4 is fixedly connected to the bottom end of the support component 1, so that the jacking component 4 can drive the support component 1, the power system load-bearing component 2 and the avionics load-bearing component 3 to elevate and fall through the output end, so as to simulate UAVs with different heights. In some embodiments, the jacking component 4 includes a trailer jack. At this time, the output end of the jacking component 4 is an elevating column, and it may be possible to control the extension or shortening of the elevating column by turning the handle 41 of the trailer jack. The above roller component 5 includes a roller stand 51 and a guide wheel 52 connected to the roller stand 51. The roller stand 51 is fixedly connected to the jacking component 4 and used to support the jacking component 4, the support component 1, the power system load-bearing component 2 and the avionics equipment load-bearing component 3. The arrangement of roller component 5 can facilitate the movement of the experimental bench for a UAV power system and avionics equipment. The guide wheel 52 can rotate freely, and can also rotate 360° freely around the elevating column.

The experimental bench for a UAV power system and avionics equipment provided by this embodiment can realize the fixing support of the power system by arranging the power system load-bearing component 2, and the fixing support of the avionics equipment by arranging the avionics equipment load-bearing component 3, without needing to install the UAV power system and avionics equipment. It can also realize the simultaneous test of the power system and avionics equipment, reduce the duration of power system test and avionics equipment test, and improve the efficiency of power system and avionics equipment test.

It should be noted that due to the different positions of the power system, the length of the signal line used for signal transmission between it and the control system is different. Due to the line loss and signal attenuation of the signal line, and the electromagnetic influence between the power systems, simulating the actual position of the power system on the UAV with the arrangement position of the power system can ensure that the test is not affected by other factors and ensure the accuracy and reliability of the test results.

Figure 2:
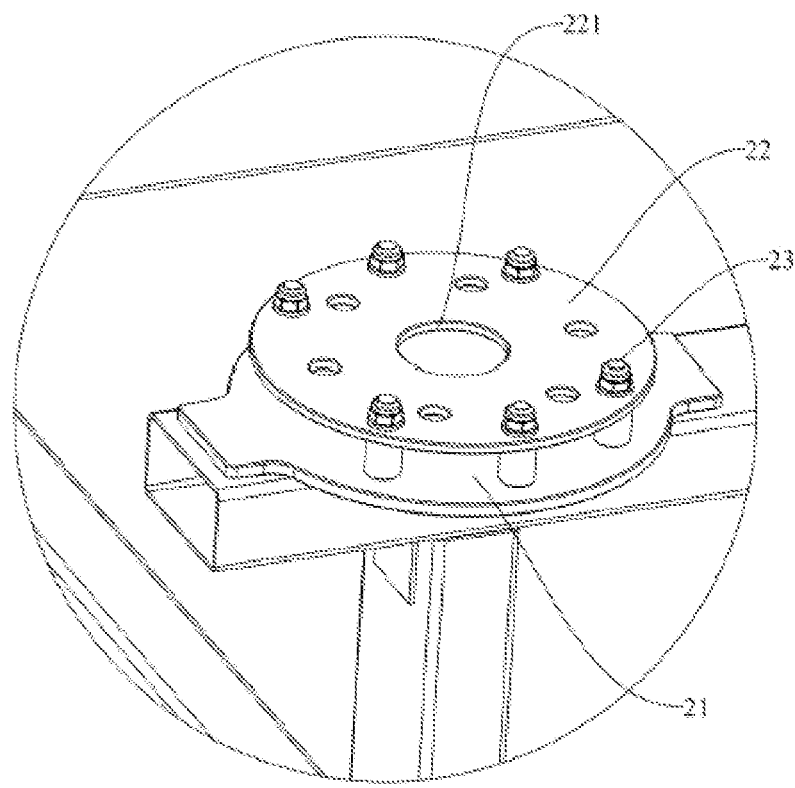
FIG. 2 is the enlarged schematic diagram of Part A in FIG. 1 of the application.

As shown in FIG. 2, the power system load-bearing component 2 includes a mounting plate 21, a fixing seat 22, and a connector 23. Wherein, the mounting plate 21 is fixedly connected to the support component 1, the fixing seat 22 is spaced from and parallel to the mounting plate 21, and the fixing seat 22 is connected to the mounting plate 21 through a connector 23. The fixing base 22 is used to fix the power system, and the fixing base 22 has a mounting hole 221 and a plurality of connecting holes for the installation of the power system, so that the power system can be firmly installed on the fixing base 22.

In some embodiments, the connector 23 comprises bolt, nut and flat washer, wherein the bolt is threaded to the fixing seat 22 by the mounting plate 21, the nut screws the bolt, and the flat washer is located between the nut and the fixing seat 22. Exemplarily, a bushing is sleeved on the part where the bolt is located between the fixing seat 22 and the mounting plate 21, and the bushing supports the fixing seat 22 so that a gap exists between the fixing seat 22 and the mounting plate 21, which is used for guiding and threading of the power system.

Figure 3:
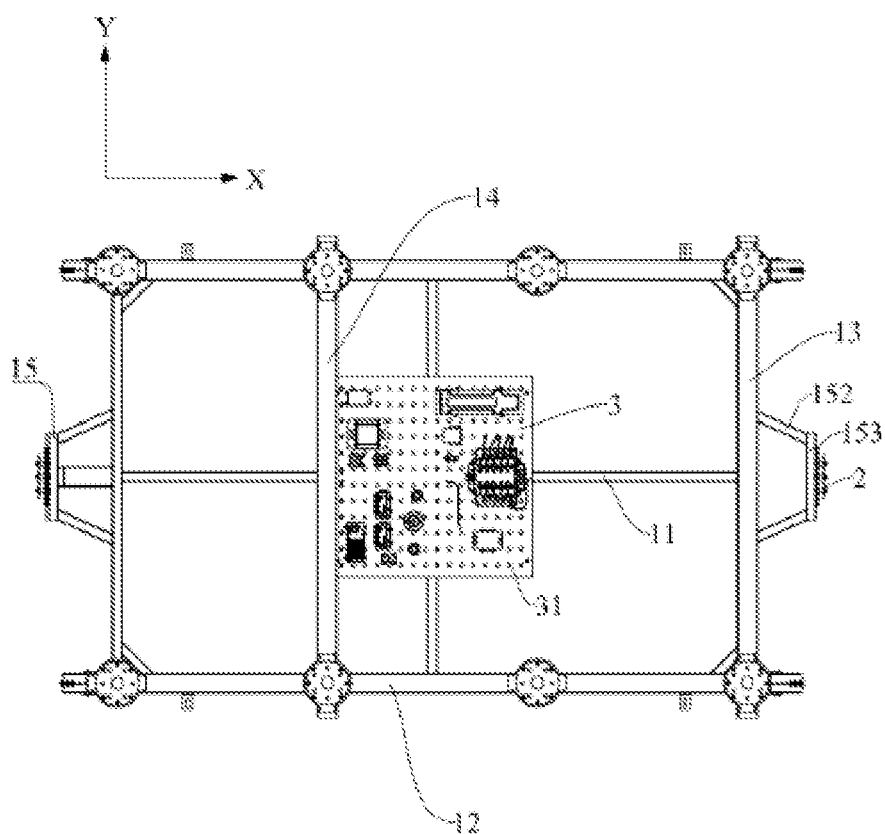
FIG. 3 is the top view of the experimental bench for a UAV power system and avionics equipment provided by an embodiment of the application.
Figure 4:
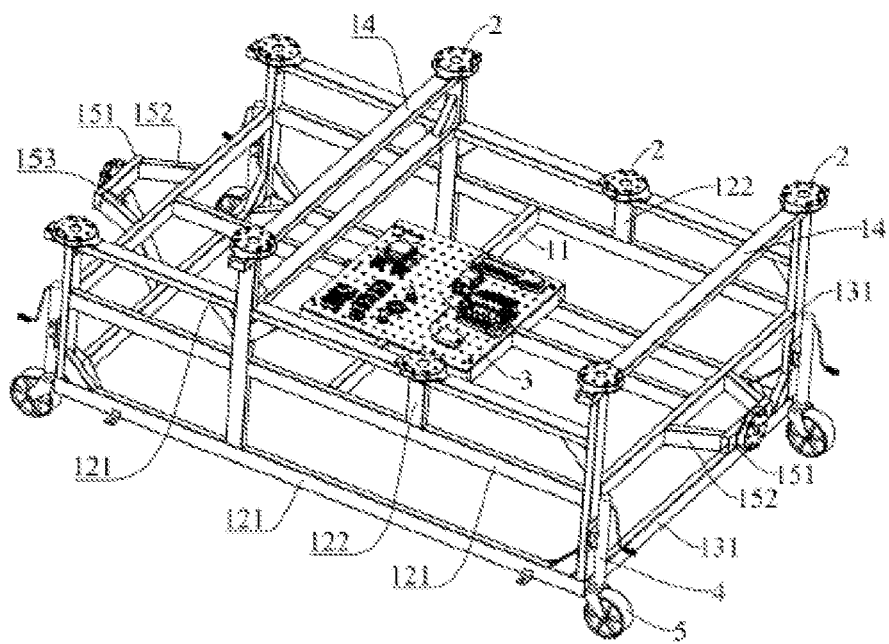
FIG. 4 is the structural diagram II of the experimental bench for a UAV power system and avionics equipment provided by an embodiment of the application.

As shown in FIGS. 3 and 4, the support component 1 comprises an outer frame and a cross frame 11 connected to the outer frame. Among them, the cross frame 11 refers to the frame with a "cross" structure. A plurality of power system load-bearing components 2 are fixedly connected to the outer frame, respectively. The avionics equipment load-bearing component 3 is fixedly connected at the intersection of the cross frame 11, that is, the avionics equipment load-bearing component 3 is fixed at the center of the cross frame 11. In this embodiment, the avionics equipment load-bearing component 3 is in a square plate shape, and the size of the avionics equipment load-bearing component 3 is large. Supporting the avionics equipment load-bearing component 3 through the cross frame 11 can improve the stability of the avionics equipment load-bearing component 3. As shown in FIG. 2, the avionics equipment load-bearing component 3 has a plurality of wire holes 31 for cable threading.

Further, as shown in FIG. 3, the outer frame comprises two X-direction frames 12 arranged opposite to each other and two Y-direction frames 13 arranged opposite to each other. The X-direction frame 12 extends along the X-direction, the Y-direction frame 13 extends along the Y-direction, and the two Y-direction frames 13 are connected between the two X-direction frames 12. Moreover, two X-direction frames 12 are connected with two Y-direction frames 13 to form a square structure. Specifically, both ends of one Y-direction frame 13 are connected to one end of one X-direction frame 12 and one end of the other X-direction frame 12, respectively, and both ends of the other Y-direction frame 13 are connected to the other end of one X-direction frame 12 and the other end of the other X-direction frame 12, respectively.

In some embodiments, the outer frame also comprises four vertical rods, the Y-direction frame 13 and the X-direction frame are connected by vertical rods, and the output end of the jacking component 4 is fixedly connected to the vertical rods. There are four jacking components 4, which correspond to four vertical rods one by one, and each jacking component 4 is fixedly connected to its corresponding vertical rod.

As shown in FIG. 3, the cross frame 11 is arranged between two X-direction frames 12 and two Y-direction frames 13. Specifically, one of the two rods of the cross frame 11 extends along the X direction and the other extends along the Y direction. The cross frame 11 is connected to two X-direction frames 12 and two Y-direction frames 13, respectively. Each X-direction frame 12 is provided with two power system load-bearing components 2 at intervals. As shown in FIG. 3, two power system load-bearing components 2 are located at the top of the X-direction frame 12, and one power system load-bearing component 2 is located at one end of the X-direction frame 12, and the other power system load-bearing component 2 is located in the middle of the X-direction frame.

Furthermore, each X-direction frame 12 comprises a plurality of second connecting rods 121, which are spaced at intervals along the vertical direction, and the power system load-bearing component 2 is arranged on the second connecting rod 121 on the uppermost layer. A reinforcing rod 122 is connected between the second connecting rod 121 on the uppermost layer and the second connecting rod 121 on the lower layer, and the power system load-bearing component 2 located in the middle of the X-direction frame 12 is located on the top surface of the part of the second connecting rod 121 connecting the reinforcing rod 122. The arrangement of the reinforcing rod 122 improves the strength of the second connecting rod 121 in the vertical direction to better support the power system.

In this embodiment, as shown in FIG. 4, the outer frame also comprises two beams 14, the two ends of each beam 14 are connected to the middle of the two X-direction frames 12, respectively, and the two ends of the beam 14 are fixedly connected with a power system load-bearing component 2, respectively. The beam 14 extends in the Y direction, and is located above the X-direction frame 12, so that the power system fixedly arranged on the power system load-bearing component 2 of the beam 14 can simulate the power system at a higher position in the UAV. In some embodiments, the beam 14 is connected to the X-direction frame 12 through a third connecting rod, which extends vertically and is connected to the second connecting rod 121 on the topmost layer of the X-direction frame 12. It should be noted that one beam 14 is connected to the middle of the X-direction frame 12, and the other beam 14 is connected to the other end of the X-direction frame 12.

Further, referring to FIG. 4, the outer frame also comprises two side brackets 15. The two side brackets 15 correspond to the two Y-direction frames 13 one by one, and each side bracket 15 is fixedly arranged on its corresponding Y-direction frame 13. As shown in FIG. 4, each side bracket 15 comprises a mounting rod 151 and two first inclined rods 152. One end of the two first inclined rods 152 is fixedly connected to the Y-direction frame 13 corresponding to the side support 15, respectively, and the other end of the two first inclined rods 152 is fixedly connected to the mounting rod 151, respectively. The first inclined rod 152 is inclined relative to the Y-direction frame 13, and the distance between one end of the two first inclined rods 152 is greater than the distance between the other ends of the two first inclined rods 152. Each mounting rod 151 is fixedly connected with a power system load-bearing component 2, so that the power system located on the power system load-bearing component 2 of the mounting rod 151 can simulate the power system of the head and tail of the UAV.

Further, as shown in FIG. 4, the Y-direction frame 13 comprises two first connecting rods 131 arranged at intervals, which are spaced in the vertical direction. Moreover, the side bracket 15 also comprises a second inclined rod 153. One end of the two first inclined rods 152 is fixedly connected to a first connecting rod 131 of the Y-direction frame 13 corresponding to the side support 150, respectively, and one end of the second inclined rod 153 is fixedly connected to another first connecting rod 131 of the Y-direction frame 13 corresponding to the side bracket 15, so that the two first inclined rods 152 and a second inclined rod 153 form a three legged state, and the other end of the second inclined rod 153 is fixedly connected to the mounting rod 151. Arranging the second inclined rod 153 can further support the reliability of the mounting rod 151, and reduce the probability of the mounting rod 151 falling.

The first connecting rod 131, the second connecting rod 121, the first inclined rod 152, the second inclined rod 153, the mounting rod 151, the vertical rod and the third connecting rod in this embodiment are hollow square steel tubes. In addition, a triangular stiffener is also arranged between the vertical rod and the second connecting rod 121 to improve the connection strength between the vertical rod and the second connecting rod 121.

The UAV in this embodiment is a V400 UAV, and the experimental bench for a UAV power system and avionics equipment comprises 10 power system load-bearing components 2. The specific positions of the 10 power system load-bearing components 2 are as follows: the first power system load-bearing component 2 is located on a mounting rod 151, the second power system load-bearing component 2 is located on another mounting rod 151, the third power system load-bearing component 2 is located at one end of the second link 121 on the uppermost layer of an X-direction frame 12, the fourth power system load-bearing component 2 is located in the middle of the second connecting rod 121 on the uppermost layer of an X-direction frame 12, and the fifth power system load-bearing component 2 is located at one end of the second connecting rod 121 on the uppermost layer of another X-direction frame 12, the sixth power system load-bearing component 2 is located in the middle of the second connecting rod 121 on the uppermost layer of the other X-direction frame 12, the seventh power system load-bearing component 2 is located at one end of a beam 14, the eighth power system load-bearing component 2 is located at the other end of a beam 14, the ninth power system load-bearing component 2 is located at one end of the other beam 14, and the tenth power system load-bearing component 2 is located at the other end of the other beam 14.

The above embodiment only expounds the basic principle and characteristics of the application. The application is not limited by the above embodiment. On the premise of not departing from the spirit and scope of the application, the application also has various changes and alternations, which fall within the breadth and scope of the application. The breadth and scope of the application is defined by the claims appended here and their equivalents.

What is claimed is:

1. An experimental bench for a UAV (unmanned aerial vehicle) power system and avionics equipment, which is characterized in that, comprising:
   a support component (1);
   a first plurality of power system load-bearing components (2), which are provided, and are fixedly arranged on the support component (1) in a linear fashion from a top view, respectively, and each of which is configured to bear a UAV power system;
   a second plurality of power system load-bearing components (2), which are provided, and are fixedly arranged on the support component (1) in a linear fashion from a top view parallel to the first plurality of power system loan-bearing components, and each of which is configured to bear a UAV power system;
   avionics equipment load-bearing component (3), which is fixedly arranged on the support component (1), and is configured to bear the UAV avionics equipment;
   a jacking component (4), the output end of which is fixedly connected to the bottom end of the support component (1); and
   a roller component (5), comprising a roller stand (51) and a guide wheel (52) connected to the roller stand (51), which is fixedly connected to the jacking component (4).

2. The experimental bench for a UAV power system and avionics equipment according to claim 1, which is characterized in that the power system load-bearing component (2) comprises a mounting plate (21), a fixing seat (22) and a connector (23), and the mounting plate (21) is fixedly connected to the support component (1), and the fixing seat (22) and the mounting plate is spaced and connected to the mounting plate (21) through the connector (23).

3. The experimental bench for a UAV power system and avionics equipment according to claim 2, which is characterized in that the fixing seat (22) has a mounting hole (221).

4. The experimental bench for a UAV power system and avionics equipment according to claim 1, which is characterized in that the support component (1) comprises an outer frame and a cross frame (11) connected in the outer frame, wherein the first and second pluralities of the power system load-bearing component (2) are fixedly arranged on the outer frame, respectively, the avionics equipment load-bearing component (3) is fixedly connected at the intersection of the cross frame (11), and the output end of the jacking component (4) is fixedly connected to the outer frame.

5. The experimental bench for a UAV power system and avionics equipment according to claim 4, which is characterized in that the outer frame comprises two oppositely arranged X-direction frames (12) and oppositely arranged Y-direction frame (13) connected between the two X-direction frames (12), and the cross frame (11) is connected to the two X-direction frames (12) and the two Y-direction frames (13), respectively, and each X-direction frame (12) is spaced with two power system load-bearing components (2).

6. The experimental bench for a UAV power system and avionics equipment according to claim 5, which is characterized in that the outer frame also comprises a beam (14), the two ends of which (14) are connected to the two X-direction frames (12) and is fixedly connected to one of the power system load-bearing component (2), respectively.

7. The experimental bench for a UAV power system and avionics equipment according to claim 5, which is characterized in that the outer frame also comprises two side brackets (15), the two side brackets (15) correspond to the two Y-direction frames (13), and the side brackets (15)

include an mounting rod (151) and two first inclined rods (152), one end of the two first inclined rods (152) is fixedly connected to the corresponding Y-direction frame (13), respectively, the other end of the two first inclined rods (152) is fixedly connected to the mounting rod (151), respectively, and the mounting rod (151) is fixedly connected with a power system load-bearing component (2).

8. The experimental bench for a UAV power system and avionics equipment according to claim 7, which is characterized in that the Y-direction frame (13) comprises two first connecting rods (131) arranged at intervals, the side brackets (15) also comprise a second inclined rod (153), and one end of the two first inclined rods (152) is fixed to one of the first connecting rods (131) of the corresponding Y-direction frame (13), respectively, one end of the second inclined rod (153) is fixedly connected to the other first connecting rod (131) of the corresponding Y-direction frame (13), and the other end of the second inclined rod (153) is fixedly connected to the mounting rod (151).

9. The experimental bench for a UAV power system and avionics equipment according to claim 1, which is characterized in that the avionics equipment load-bearing assembly (3) has a plurality of wire holes (31).

10. The experimental bench for a UAV power system and avionics equipment according to claim 1, which is characterized in that the jacking component (4) comprises a trailer jack.

\* \* \* \* \*